United States Patent
Yamada et al.

(10) Patent No.: US 7,603,604 B2
(45) Date of Patent: Oct. 13, 2009

(54) TEST APPARATUS AND ELECTRONIC DEVICE

(75) Inventors: Tatsuya Yamada, Tokyo (JP); Kiyoshi Murata, Tokyo (JP)

(73) Assignee: Advantest Corporation, Tokyo (JP)

( * ) Notice: Subject to any disclaimer, the term of this patent is extended or adjusted under 35 U.S.C. 154(b) by 255 days.

(21) Appl. No.: 11/733,174

(22) Filed: Apr. 9, 2007

(65) Prior Publication Data

US 2008/0250291 A1   Oct. 9, 2008

(51) Int. Cl.
    *G06F 11/00* (2006.01)
(52) U.S. Cl. .......................... 714/738; 714/743
(58) Field of Classification Search ............ 714/738, 714/743
    See application file for complete search history.

(56) References Cited

U.S. PATENT DOCUMENTS 5,737,512 A * 4/1998 Proudfoot et al. ............ 714/32

6,769,083 B1 * 7/2004 Tsuto et al. .................. 714/738

FOREIGN PATENT DOCUMENTS

| JP | 0269685    | 3/1990 |
| JP | 0742150    | 2/1995 |
| JP | 200040389  | 2/2000 |
| JP | 2000162287 | 6/2000 |
| JP | 2000-206210| 7/2000 |
| JP | 2002521698 | 7/2002 |
| JP | 200328936  | 1/2003 |

* cited by examiner

*Primary Examiner*—Kevin L Ellis
*Assistant Examiner*—Steve Nguyen
(74) *Attorney, Agent, or Firm*—Osha • Liang LLP

(57) ABSTRACT

A test apparatus that tests a device under test is provided. The test apparatus includes: a pattern memory that stores in a compression format a test instruction sequence to define a test sequence for testing the device under test; an expanding section mat expands in a non-compression format the test instruction sequence read from the pattern memory; an instruction cache that caches the test instruction sequence which is expanded by the expanding section; a pattern generating section that sequentially reads instructions stored in the instruction cache and executes the same to generate a test pattern for the executed instruction; and a signal output section that generate a test signal based on the test pattern and provides the same to the device under test.

10 Claims, 11 Drawing Sheets

SEQUENCE DATA
(TEST INSTRUCTION SEQUENCE)

```
XXXX        NOP
XXXX        NOP
             .
             .
             .
XXXX        JMP       X
             .
             .
             .
XXXX        IDX1      Y
             .
             .
             .
XXXX        EXIT
```

*FIG. 5*

TEST APPARATUS AND ELECTRONIC DEVICE

BACKGROUND

1. Technical Field

The present invention relates to a test apparatus and an electronic device. Particularly, the present invention relates to a test apparatus that tests a device under test and an electronic device including a test circuit that tests a circuit under test.

2. Related Art

Generally, a test apparatus that tests a device under test such as a semiconductor has been known. The test apparatus provides a test signal having a predetermined logic pattern to the device under test and detects a signal outputted from the device under test in accordance with the test signal. Then, the test apparatus determines whether the device under test passes or fails by comparing the detected signal with the expected value.

The test apparatus includes a pattern generator that sequentially generates test patterns and a test signal outputting section that outputs a test signal having the logic in accordance with each of the test patterns as disclosed, for example, in Japanese Patent Application Publication No. 2000-206210. The pattern generator sequentially reads instructions from sequence data (test instruction sequence) stored in the memory and executes the read instructions. Then, the pattern generator reads the pattern data corresponding to each of the executed instructions from the memory and sequentially outputs the read pattern data as test patterns. Thereby the test apparatus can provide the test signal having a predetermined logic pattern to the device under test.

By the way, the items and the contents for the test are increased along with improving the function of the device under test, so that the number of instructions included in the sequence data is increased. Therefore, the capacity of the memory in which the sequence data is stored in the test apparatus could be increased.

SUMMARY

Accordingly, it is an advantage of the invention to provide a test apparatus and an electronic device which are capable of solving the above-mentioned problem. This advantage may be achieved through the combination of features described in independent claims of the invention. Dependent claims thereof specify preferable embodiments of the invention.

Thus, a first aspect of the present invention provides a test apparatus that tests a device under test. The test apparatus includes: a pattern memory that stores a test instruction sequence which defines a test sequence to test the device under test in the compression format; an expanding section that expands the test instruction sequence read from the pattern memory to mat in the non-compression format; an instruction cache mat caches the test instruction sequence expanded by the expanding section; a pattern generating section that sequentially reads the instructions stored in the instruction cache and executes the same to generate a test pattern for the executed instruction; and a signal outputting section that generates a test signal based on the test pattern and provides the same to the device under test.

A second aspect of the present invention provides an electronic device including a circuit under test and a test circuit that tests the circuit under test. The test circuit includes: a pattern memory that stores a test instruction sequence which defines a test sequence to test the circuit under test in the compression format; an expanding section that expands the test instruction sequence read from the pattern memory to that in the non-compression format; an instruction cache that caches the test instruction sequence expanded by the expanding section; a pattern generating section that sequentially reads the instructions stored in the instruction cache and executes the same to generate a test pattern for the executed instruction; and a signal outputting section that generates a test signal based on the test pattern and provides the same to the circuit under-test.

It is noted that the summary of the invention described above does not necessarily describe all necessary features of the invention. The invention may also be a sub-combination of the features described above.

BRIEF DESCRIPTION OF DRAWINGS

FIG. 5 shows an example of sequence data (test instruction sequence) before being compressed;

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
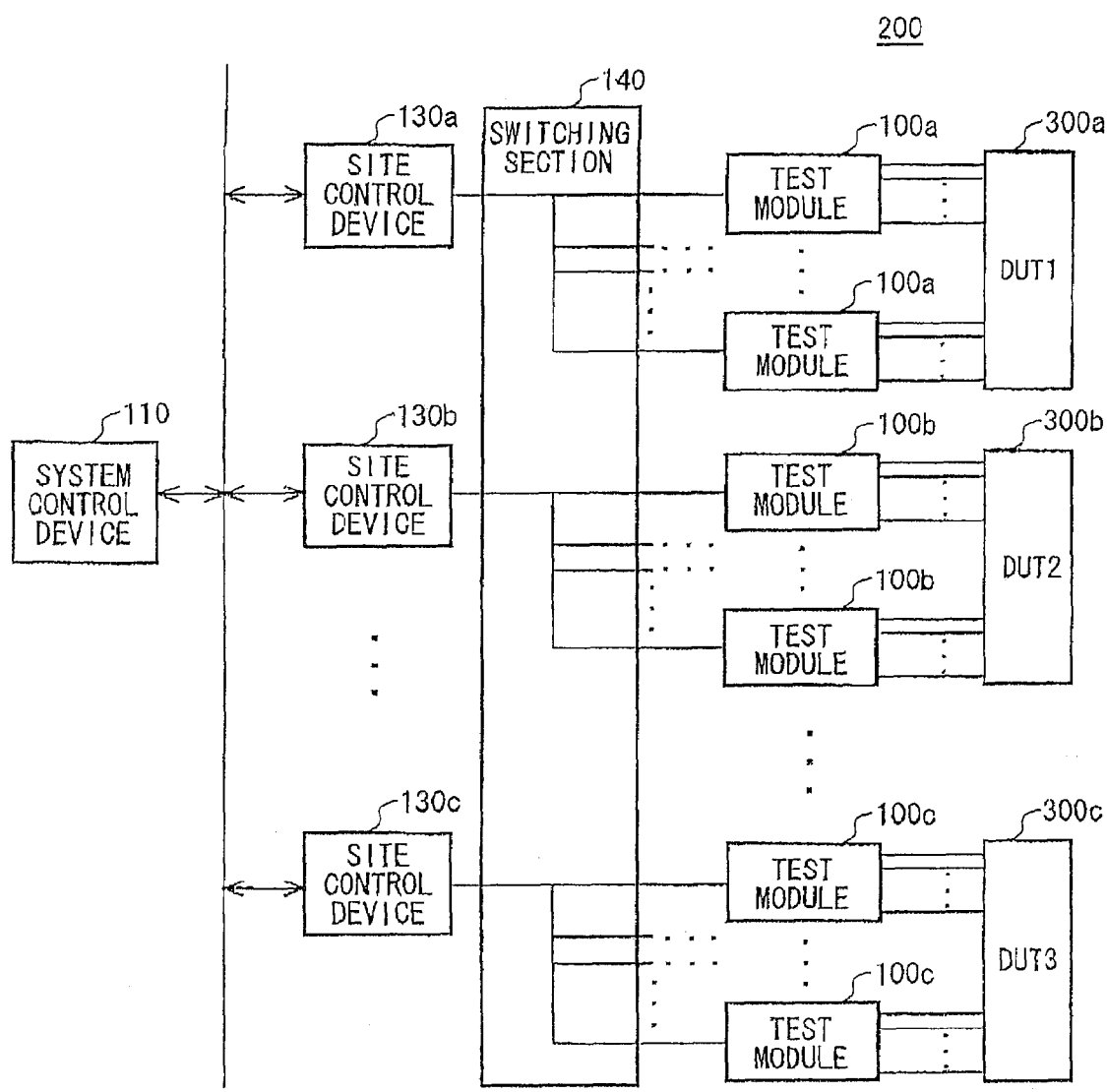
FIG. 1 shows an example of the configuration of a test apparatus 200 according to an embodiment of the present invention.

FIG. 1 shows an example of configuration of a test apparatus 200 according to au embodiment of the present invention. The test apparatus 200 tests device under tests 300 such as semiconductor circuits and includes a system control device 110, a plurality of site control devices 130, a switching section 140 and a plurality of test modules 100.

The system control device 110 receives a test control program, test program data and test pattern data used by the test apparatus 200 to test the device under tests 300 through an external network and stores therein the same. The plurality of site control devices 130 are connected to the system control device 110 through a communication network.

The site control devices 130*a-c* controls to test any of the device under tests 300. For example, each of the plurality of site control devices 130 is arranged corresponding to each of the device under tests 300 one on one. Each of the site control devices 130 controls the corresponding device under test 300.

The site control device 130*a* controls to test the device under test 300*a*, and the site control device 130*b* controls to test the device under test 300*b* in FIG. 1. Alternatively, the plurality of site control devices 130 may control to each of the plurality of device under tests 300, respectively.

Specifically, the site control device 130 acquires the test control program from the system control device 110 and executes the same. Next, the site control device 130 acquires from the system control device 110 the test program data such as sequence data described later and the test pattern data such as pattern data described later used to test the corresponding device under test 300 based on the test control program. Hereinafter, the test program data and the test pattern data are genetically referred to as test pattern rows. The data row may be data including at least one of the test program data and the test pattern data.

In addition, the site control device 130 stores in one or more test modules 100 used to test the device under tests 300 through the switching section 140. Next, the site control device 130 instructs the test modules 100 to start to test in accordance with the test program data and the test pattern data through the switching section 140. Then, the site control device 130 receives such as an interrupt indicating that the test is terminated from the test modules 100 and causes the test modules 100 to perform the next test based on the test result.

The switching section 140 connects each of the plurality of site control devices 130 to the plurality of test modules 100 controlled by the each of the plurality of site control devices 130 and relays the communication therebetween. Here, a predetermined site control device 130 may set the switching section 140 in order to connect each of the site control devices 130 to one or more test modules used to test the device under test 300 by the site control device 130 based on the instruction by such as the user of the test apparatus 200 and the test control program.

For example, the site control device 130*a* is set to be connected to the plurality of test modules 100*a* and tests the device under test 300*a* by using the plurality of test modules 100 in FIG. 1. Here, the configuration and the operation of the other site control devices 130 to test the device under tests 300 by using the test modules 100 may be the same as those of the site control device 130*a* to test the device under test 300*a*. Hereinafter, it will be mainly described that the configuration and the operation of the site control device 130*a* to test the device under test 300*a*.

The test module 100*a* generates a timing signal appropriate for generating a test signal used to test the device under test 300*a* based on the instruction by the site control device 130*a*. In addition, any of the test modules 100*a* may receive the test result of the other test module 100*a* and cause the plurality of test modules 100*a* to execute the sequence corresponding to pass/fail of the test result.

Each of the plurality of test modules 100*a* is connected to each of a plurality of terminals included in the device under test 300*a* and tests the device under test 300*a* based on the sequence data and the pattern data stored in the site control device 130*a*. Testing the device under test 300*a*, the test modules 100*a* generate test signals from the pattern data based on the sequence data and the pattern data designated by a pattern list described later and provides the test signal to the terminal of the device under test 300*a* connected to the test module 100*a*.

Next, each of the test modules 100*a* acquires an output signal as the result that the device under test 300*a* operates based on the test signal and compares the same with air expected value. Here, each of the plurality of test modules 100*a* may generate a test signal based on cycle periods different from each other in order to dynamically change the cycle period of the test signal based on the sequence data and the pattern data.

In addition, completing the processing of the test program data, the test module 100*a* generates an interrupt on the site control device 130*a* when any failure occurs during executing the test program data. The interrupt is notified to the site control device 130*a* corresponding to the test module 100*a* through the switching section 140, so that a processor included in the site control device 130*a* performs an interrupt processing.

Here, the test apparatus 200 is provided by air open architecture, and can use various modules which meet the open architecture standard. Then, the test apparatus 200 can insert the module such as the test module 100 into any connecting slot included in the switching section 140.

In this case, the user of the test apparatus 200 can change the connection configuration through such as the site control device 130*a* and connect a plurality of modules used to test the device under tests 300 to the site control devices 130 to control to test the device under tests 300. Thereby the user of the test apparatus 200 can select the appropriate module dependent on the number of terminals, the placement of terminals, the kind of terminals or the kind of test for each of the plurality of device under tests 300 and implement the same in the test apparatus 200.

In addition, the test apparatus 200 or the test module 100 may be a test circuit provided in the same electronic device in which the targeted circuit under test is provided. The test circuit is provided as such as a BIST circuit of the electronic device and diagnoses the electronic device by testing the circuit under test. Thereby the test circuit can check whether a circuit to be a circuit under test can normally perform the original operation as an electronic device.

In addition, the test apparatus 200 or the test module 100 may be a test circuit provided on the same board or in the same apparatus on/in which a circuit under test is provided. Such test circuit also can check whether the circuit under test can normally perform the original operation as an electronic device.

Figure 2:
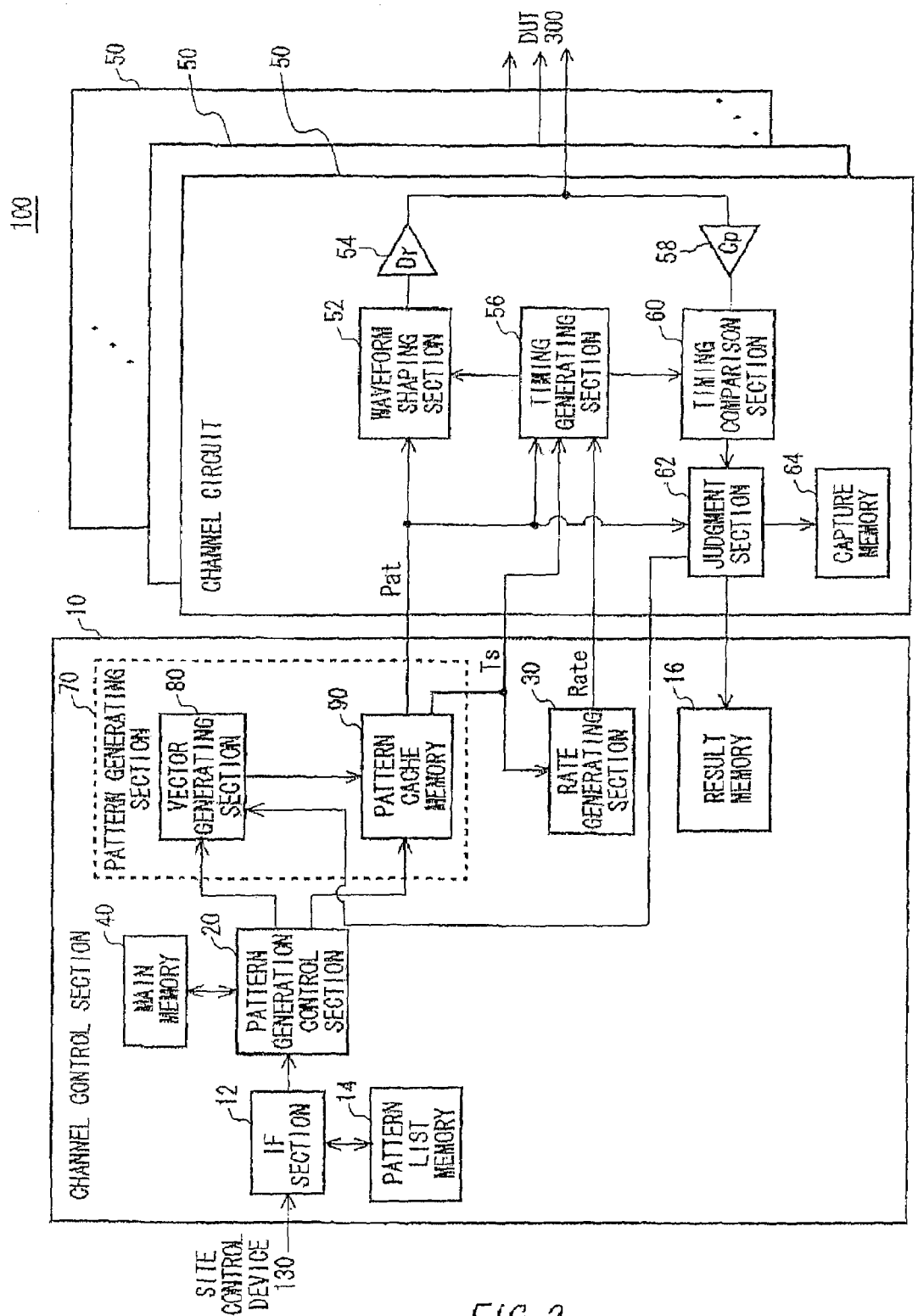
FIG. 2 shows an example of the configuration of a test module 100.

FIG. 2 shows an example of configuration of the test module 100. The test module 100 includes a channel control section 10 and a plurality of channel circuits 50. The function and the configuration of one channel circuit 50 will be described in the present embodiment. However, the other channel circuits may be the same function and configuration.

Each of the channel circuits 50 may be connected to input arid output pin corresponding to the device under test 300 and provide a test signal to the input and output pins. In addition, each of the channel circuits 50 may measure an output signal from the input/output pins. Here, the input and output pins of the device under test 300 may be either the input pin or the output pin.

The channel control section 10 controls each of the channel circuits 50. For example, the channel control section 10 controls each of the channel circuits 50 to generate a test signal. In addition, the channel control section 10 controls each of the channel circuits 50 to measure an output signal from the device under test 300.

In addition, the channel control section 10 may control the other channel circuit 50 based on the measurement result of any channel circuit 50. For example, the channel control section 10 may cause at least one of the oilier channel circuits 50 to iteratively perform a predetermined operation until the measurement result of any of the channel circuits 50 satisfies a predetermined condition and causes the other channel circuit 50 to perform the next appropriate operation provided that the measurement result satisfies the predetermined condition.

The channel control section 10 includes an interface section 12, a pattern list memory 14, a result memory 16, a pattern generation controlling section 20, a main memory 40, a rate generating section 30 and a pattern generating section 70. The interface section 12 passes the data between the site control devices 130 and the test modules 100.

The main memory 40 stores therein the plural kinds of sequence data and pattern data corresponding to the sequence data. The main memory 40 may previously store the sequence data arid the pattern data provided from the site control devices 130 before testing the device under test 300. In addition, the main memory 40 may compress and stores the sequence data and the pattern data.

For example, the site control section 130 may input to the interface section 12 the sequence data, the pattern data and an instruction to store those data on the designated addresses of the main memory 40. The pattern generation control section 20 stores those data in the main memory 40 in accordance with the instruction received by the interface section 12.

The sequence data may be data indicative of an instruction group to be sequentially executed, for example. Here, one instruction in sequence data may be corresponding to the test data, and a plurality of instruction may be corresponding to the test data.

The pattern data is data indicative of such as a logical value pattern, and may be stored in association with a plurality of instructions one-on-one. For example, the sequence data may be an instruction group cause to generate a test pattern by outputting each of the pattern data in a predetermined order. Here, the data for one instruction among the pattern data may be corresponding to the test data, and data for a plurality of instructions among the pattern data may be corresponding to the test data.

At this time, the sequence data may generate the test pattern by using each of the pattern data several times. For example, the sequence data may include such as a loop instruction and a JMP instruction. When the channel control section 10 executes such sequence data, the corresponding pattern data is expanded to generate a test signal corresponding to the sequence data and the pattern data. An example of the sequence data and pattern data stored hi the main memory 40 will be described later with reference to FIG. 3.

The pattern list memory 14 stores therein a pattern list indicative of an appropriate order of executing the sequence data stored in the main memory 40. For example, the pattern list memory 14 may store the pattern list that sequentially designates addresses of the sequence data to be executed in the main memory 40. The pattern list memory 14 may previously store the pattern list provided from the site control devices 130 before testing the device under test 300 as well as the main memory 40. The pattern list may be an example of the above described test control program and also may be a part of the test control program.

The pattern generation control section 20 reads the pattern list from the pattern list memory 14 when the test apparatus 200 starts to test the device under test 300. For example, receiving an instruction on the start of the test from the site control device 130, the pattern generation control section 20 may read the pattern list from the pattern list memory 14.

The pattern generation control section 20 reads the sequence data and the corresponding pattern data stored in the main memory 40 in the order according to the pattern list. The pattern generation controlling section 20 transmits the read sequence data to a vector generating section 80 of the pattern generating section 70. In addition, the pattern generation control section 20 transmits the read pattern data to a pattern cache memory 90 of the pattern generating section 70.

The pattern generation control section 20 may read the next sequence data and pattern data and transmit the same when there is a predetermined free area in such as a cache memory and a FIFO memory of a subsequent circuit. In this case, the pattern generation control section 20 may read the next sequence data and pattern data provided that there is the predetermined free area in all the cache memory and FIFO which should store the sequence data and the pattern data, and transmit the same to the cache memory and the FIFO.

The pattern generating section 70 sequentially generate test patterns based on the sequence data and the pattern data sequentially received from the pattern generation control section 20. The pattern generating section 70 according to the present embodiment includes the vector generating section 80 and the pattern cache memory 90.

As described above, the vector generating section 80 receives the sequence data from the pattern generation control section 20.

The vector generating section 80 may include a sequence cache memory that stores the received sequence data in a predetermined cache entry (hereinafter referred to as an entry). The pattern cache memory 90 receives the pattern data from the pattern generation control section 20 and stores the same in the predetermined entry. The entry may be a storage area which is designated by one or more addresses.

The vector generating section 80 sequentially executes the sequence data stored in the sequence cache memory and sequentially designates the addresses in the pattern cache memory 90. For example, the address of the pattern data to be designated according to instructions may be associated with each of the instructions of the sequence data. Then, the vector generating section 80 sequentially designates the addresses in the pattern cache memory 90 according to such as a loop instruction and a IMP instruction included in the sequence data.

The pattern cache memory 90 outputs the pattern data of the addresses sequentially designated. Thereby a test pattern having a logic pattern in accordance with the sequence data and the pattern data can be generated. In addition, the sequence cache memory and the pattern cache memory 90 may open the storage area for the sequence data and the corresponding pattern data after the sequence data is completely executed. The sequence data may include a termination instruction indicative of the termination of the sequence data at the end of the instruction group.

Each of the channel circuits 50 shapes a test signal based on the test pattern outputted by the pattern generating section and inputs the same to the device under test 300. In addition, each of the channel circuits 50 measures an output signal from the device under test 300. Each of the channel circuit 50 includes an waveform shaping section 52, a driver 54, a timing generating section 56, a comparator 58, a timing comparison section 60, a judgment section 62 and a capture memory 64.

The waveform shaping section 52 shapes the test signal based on the test pattern generated by the pattern generating section 70. For example, the waveform shaping section 52 may generate a test signal having a logic pattern in accordance with the test pattern. In addition, the waveform shaping section 52 may generate a test signal in accordance with a given timing signal. For example, the waveform shaping section 52 may generate a test signal of which logical value is changed in accordance with the given timing signal.

The driver 54 inputs the test signal generated by the waveform shaping section 52 to the device under test 300. The driver 54 may convert the voltage level of the test signal to the signal level appropriate to be inputted to the device under test 300 by outputting the voltage at a predetermined level H when the test signal generated by the waveform shaping section 52 indicates logic H, and by outputting the voltage at a predetermined level L when the test signal indicates logic L.

The comparator 58 may receive the output signal from the device under test 300, and convert the output signal to a binary logic signal by comparing the voltage level of the output signal with a preset reference level. For example, the comparator 58 may output logic H when the voltage level of the output signal is higher than the reference level, and output logic L when the voltage level of the output signal is lower than the reference level.

The timing comparison section 60 acquires the logical value of the signal outputted by the comparator 58 in accordance with a given strobe signal. Thereby the logic pattern of the output signal can be detected.

The timing generating section 56 generates the timing signal and the strobe signal described above in accordance with a setting value of a prepared timing set. For example, the timing generating section 56 may generate a timing signal and a strobe signal obtained by delaying a rate signal provided from the rate generating section 30 at a period corresponding to the timing set by the amount of delay corresponding to the given timing set.

The timing set may be provided to the rate generating section 30 and the timing generating section 56 every time one sequence data is executed, for example. The main memory 40 may include the data of the timing set as a part of the pattern data corresponding to the sequence data, for example. The pattern generating section 70 may set the timing set corresponding to the sequence data to the rate generating section 30 and the timing generating section 56 every time each sequence data is executed.

The judgment section 62 compares the logic pattern detected by the timing comparison section 60 with an expected value pattern. Thereby pass/fail of the device under test 300 can be judged. The expected value pattern may be generated by the pattern generating section 70. For example, the expected value pattern may be equal to the logic pattern of the test signal inputted to the device under test 300, which is included in the test pattern generated by the pattern generating section 70. In addition, the judgment section 62 may detect whether the logic pattern detected by the timing comparison section 60 is corresponding to the expected value, for example. Thereby the judgment section 62 can detect that the output signal from the device under test is corresponding to the predesignated value. The judgment section 62 may provide a match signal indicating that the output signal from the device under test 300 is corresponding to the predesignated value to the pattern generating section 70.

The capture memory 64 stores the result by the judgment section 62. For example, the capture memory 64 may store therein e result of pass (matching) and fail (mismatching) by the judgment section 62 for each test pattern. In addition, the capture memory 64 may select the result of fail by the judgment section 62 and store therein the same.

The result memory 16 of the channel control section 10 stores the result by the judgment section 62 in each channel circuit 50. The result memory 16 may store therein the result of pass (matching) and fail (mismatching) by the each of the judgment sections 62 in association with each channel for each test pattern. The result memory 16 may select the result of fail by each of the judgment sections 62 and store therein the same.

As described above, the capture memory 64 may store therein for each channel circuit 50 the fail information for each test pattern. Meanwhile, the result memory 16 may store for each device under test 300 the fail information for each sequence data stored in the pattern list memory 14.

Figure 3:
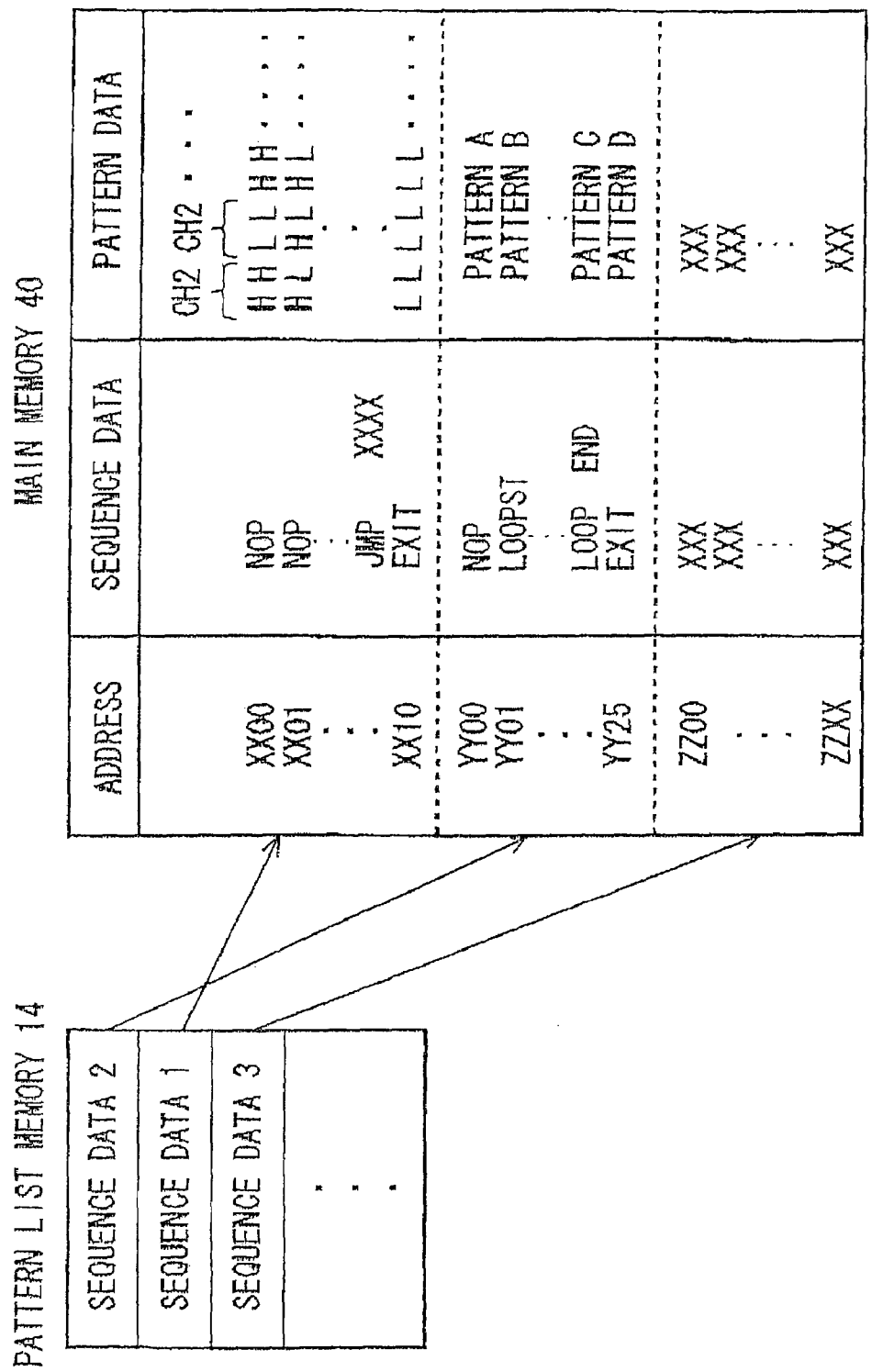
FIG. 3 is explanatory diagram showing an example of pattern lists stored in a pattern list memory 14, and sequence data and pattern data stored in a main memory 40.

FIG. 3 is explanatory diagram showing an example of pattern lists stored in the pattern list memory 14, and sequence data and pattern, data stored in a main memory 40. As described above, the main memory 40 stores a plurality of sequence data (sequence data 1, sequence data 2 . . . ) and the pattern data each of which is corresponding to each sequence data.

As described above, the sequence data includes a plurality of instructions. When each of the instructions are executed, the pattern generating section 70 may output the pattern data corresponding to each of the instructions. For example, the sequence data may include NOP instruction to output the corresponding pattern data and shift the following instruction, JMP instruction to output the corresponding pattern data and further JMP to the instruction at a predetermined address and LOOP instruction to output the corresponding pattern data and further iterate the instruction within the designated address range a predetermined number of times.

By executing such instruction group, each of the pattern data is outputted in order corresponding to the sequence data and a predetermined test pattern is generated. For example, when the sequence data 2 is executed, the pattern generating section 70 iteratively outputs the pattern data B the pattern data C the number of times designated by the LOOP instruction after outputting the pattern data A.

The main memory 40 may store therein the sequence data common to the plurality of channel circuits 50. In addition, the main memory 40 may store the pattern data for each of the channel circuits 50. For example, the main memory 40 may store the pattern data corresponding to the plurality of channel circuits for each of the instructions of the sequence data. The main memory 40 stores therein the pattern data corresponding to each of the channel circuits 50 at the bit position of which address is different from each other in FIG. 3.

The pattern memory 14 stores therein the order of the sequence data to be executed. The pattern list memory 14 stores a pattern list to sequentially designate the sequence data 2 and the sequence data 1 in FIG. 3.

The main memory 40 that stores therein the sequence data and the pattern data is provided in the channel control section 10 in the embodiment shown in FIG. 2. Meanwhile, the main memory 40 that stores therein the sequence data may be provided in the channel control section 10, and a memory mat stores therein the pattern data for each of the channel circuits 50 may be provided in each of the channel circuits 50 in the other embodiment.

In this case, the pattern cache memory 90 may be provided in each of the channel circuits 50. Then, the addresses sequentially designated by the vector generating section 80 may be distributed to the pattern cache memory 90 provided in each of the channel circuits 50.

Figure 4:
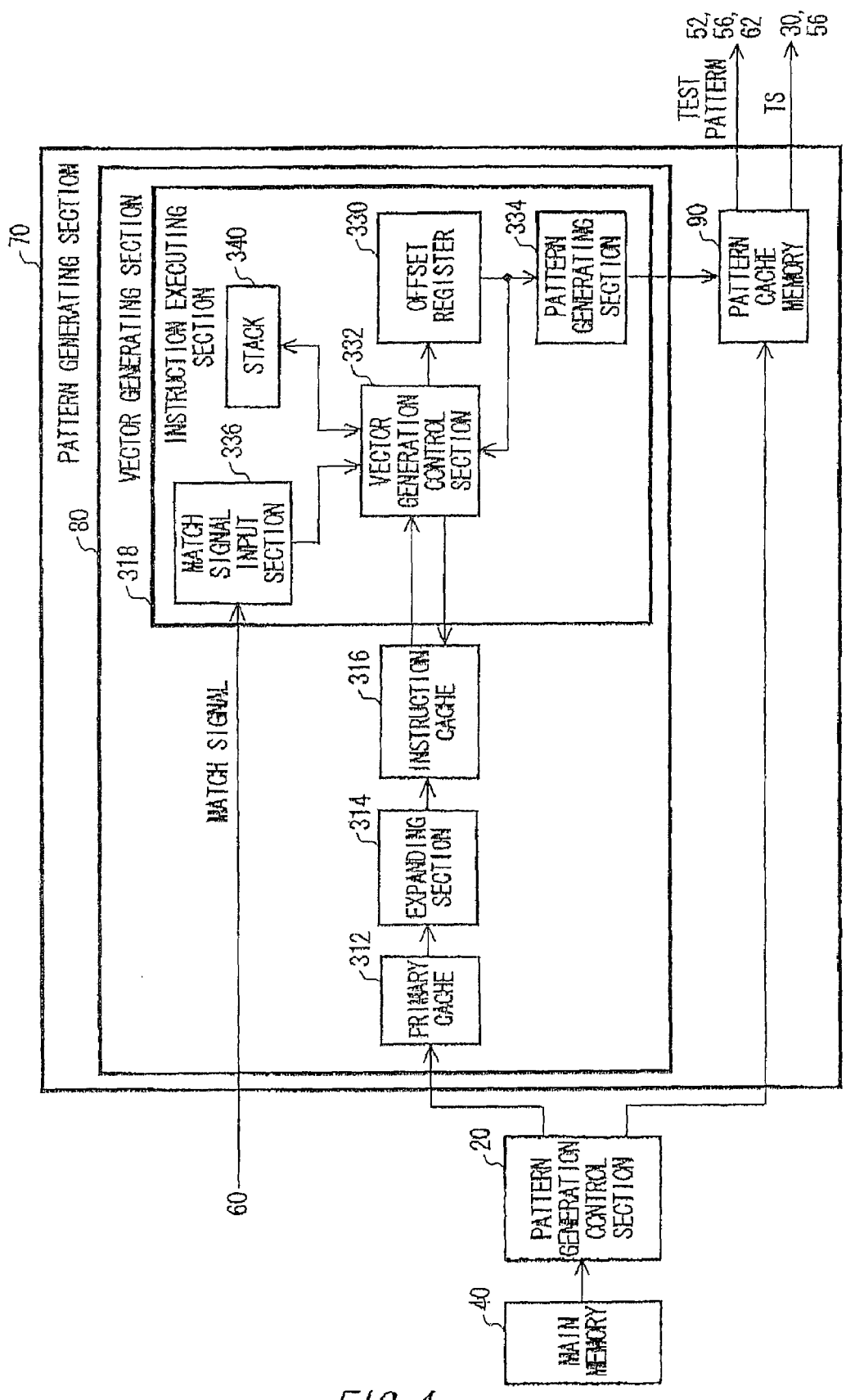
FIG. 4 shows an example of configuration of a pattern generating section 70 according to an embodiment along with the main memory 40 and the pattern generation control section 20.

FIG. 4 shows an example of configuration of a pattern generating section 70 according to an embodiment along with the main memory 40 and the pattern generation control section 20. The vector generating section 80 includes a primary cache 312, an expanding section 314, an instruction cache 316 and an instruction executing section 318.

The main, memory 40 stores the test instruction sequence (sequence data) that defines the test sequence to test the device under test 300. The main memory 40 stores the sequence data in a compression format. Moreover, the main memory 40 stores the test pattern sequence (pattern data) including the test pattern associated with each instruction included in the sequence data before being compressed.

The primary cache 312 included in the vector generating section 80 stores the sequence data in the compression format. The primary cache 312 is air example of the pattern memory according to the present embodiment. The pattern cache memory 90 stores the pattern data.

The pattern generation control section 20 reads the sequence data stored in the main memory 40 in accordance with the description of the pattern list and writes the same to the primary cache 312. Tire pattern generation control section 20 reads the pattern data stored in the main memory 40 in accordance with the pattern list and writes the same to the pattern cache memory 90.

The expanding section 314 reads the sequence data from the primary cache 312 and writes the same to the instruction cache 316. In this case, the expanding section 314 expands the sequence data in the compression format which is read from the cache 312 to the sequence data in the non-compression format.

The instruction cache 316 caches the sequence data which is read from the primary cache 312 by the expanding section 314 and expanded in the non-compression format. Each instruction included in the sequence data which is cached in the instruction cache 316 is associated with the test pattern included in the pattern data stored in the pattern cache memory 90.

The instruction executing section 318 sequentially reads the instructions included in the sequence data stored in the instruction cache 316 and executes the same. Here, the offset indicative of the location of each instruction is allocated to the instruction included in the sequence data. The instruction executing section 318 iteratively performs the following processing: executing the instruction; specifying the offset of the instruction to be executed next, which is defined according to the executed instruction, reading the instruction of the specified offset from the instruction cache 316 and executing the read instruction. Thereby the instruction executing section 318 can execute the test sequence defined by the sequence data.

In addition, executing the instruction, the instruction executing section 318 converts the offset allocated to the instruction to a vector address to designate the test pattern corresponding to the instruction. The instruction executing section 318 provides the vector address to the pattern cache memory 90 and causes the pattern cache memory 90 to output the test pattern corresponding to the executed instruction. The pattern cache memory 90 provides the test pattern to the channel circuit 50. Then, the channel circuit 50 generates a test signal corresponding to the provided test pattern and provides the same to the device under test 300. The pattern cache memory 90 provides the test pattern to the waveform shaping section 52, the timing generating section 56 and the judgment section 62, for example.

In addition, timing set information (TS) for designating a set of timings to output the corresponding test pattern is associated with each instruction included in the sequence data. Executing the instruction, the instruction executing section 318 causes the pattern cache memory 90 to output the timing set information associated with the instruction, which is corresponding to the test pattern outputted from the pattern cache memory 90 to the rate generating section 30 and the timing generating section 56.

In the present embodiment, the instruction executing section 318 includes an offset register 330, a vector generation control section 332, a pattern generating section 334, a match signal input section 336 and a stack 340. The offset register 330 stores the instruction executed next by the vector generating section 332 and the offset of the corresponding test pattern.

The vector generation control section 332 sequentially reads the instructions stored in the instruction cache 316 and executes the same. Specifically, the vector generation control section 332 reads the instruction of the offset designated by the offset register 330 from the instruction cache 316 and executes the same. Moreover, the vector generation control section 332 updates the value of the offset register 330 in accordance with the executed instruction. More specifically, the vector generation control section 332 increments the value of the offset register 330 every time the instructions axe sequentially executed. In addition, when a jump instruction is executed, the vector generation control section 332 loads the offset of the instruction at a JMP destination into the offset register 330.

Here, the vector generation control section 332 may read the instruction by providing the offset stored in the offset register 330, which is in synchronism with the clock cycle, to the instruction cache 316. In addition, when the vector generation control section 332 reads the instruction in asynchronism with the clock cycle, the instruction cache 316 may receive the offset from the offset register 330 without through the vector generation control section 332.

The pattern generating section 334 outputs the test pattern corresponding to the offset stored in the offset register 330. Specifically, the pattern generating section 334 converts the offset stored in the offset register 330 to a vector address and provides the same to the pattern cache memory 90.

The match signal input section 336 inputs a match signal outputted from the timing comparison section 60, which indicates that the output signal from the device under test 300 is corresponding to the predesignated value. Then, the match signal input section 336 stores fire inputted match signal in a register which can be read by such as the vector generation control section 332.

Iteratively performing a loop interval including one or more instructions, the stack 340 stores the number of times of iterating to perform the loop interval. Here, the stack 340 can store therein a plurality of number of times of iterating. The stack 340 stores the number of times of iteration which is pushed last at the head thereof, and then, the number of times of iteration are sequentially hopped out from one which is pushed last.

FIG. 5 shows an example of sequence data (test instruction sequence) before being compressed. For example, the sequence data before being compressed may include NOP (NO Operation) instruction, Jump instruction (JMP instruction), Iteration instruction (IDXI instruction) and Exit instruction (EXIT instruction).

NOP instruction is an instruction which does not change the test sequence and also does not explicitly change the register value in the test apparatus 200. Executing NOP instruction, the instruction executing section 318 specifies the instruction to which the offset following the NOP instruction is allocated as the instruction to be executed next.

When any data is not corresponding to the designated condition (or corresponding to that), the JMP instruction causes the executed instruction before the JMP instruction to be designated as the instruction to be executed next. Thereby the instruction executing section 318 may return the processing to the executed instruction again to iterate from the executed instruction to the JMP instruction. Meanwhile, when any data is corresponding to the designated condition (or not corresponding to that), the JMP instruction causes the instruction to which the offset following the JMP instruction is allocated to be designated as the instruction to be executed next. Thereby the instruction executing section 318 can exit from the loop processing and advance the processing to the following instruction.

IDXI instruction is an instruction to iteratively output the corresponding pattern data by the designated number of times. Executing IDXI instruction, the instruction executing section 318 does not shift the processing to the following instruction until the designated cycle is counted from when the IDXI instruction is executed. Then, after passing the designated cycle during executing IDXI instruction, the instruction executing section 318 designates the instruction to which the offset following the IDXI instruction is allocated as the instruction to be executed next.

EXIT instruction is an instruction to exit from executing the sequence data. Executing EXIT instruction, the instruction executing section 318 does not designate the instruction to be executed next and exits from executing the sequence data. Then, the instruction executing section 318 shifts the processing to the other sequence data to be executed next.

Figure 6:
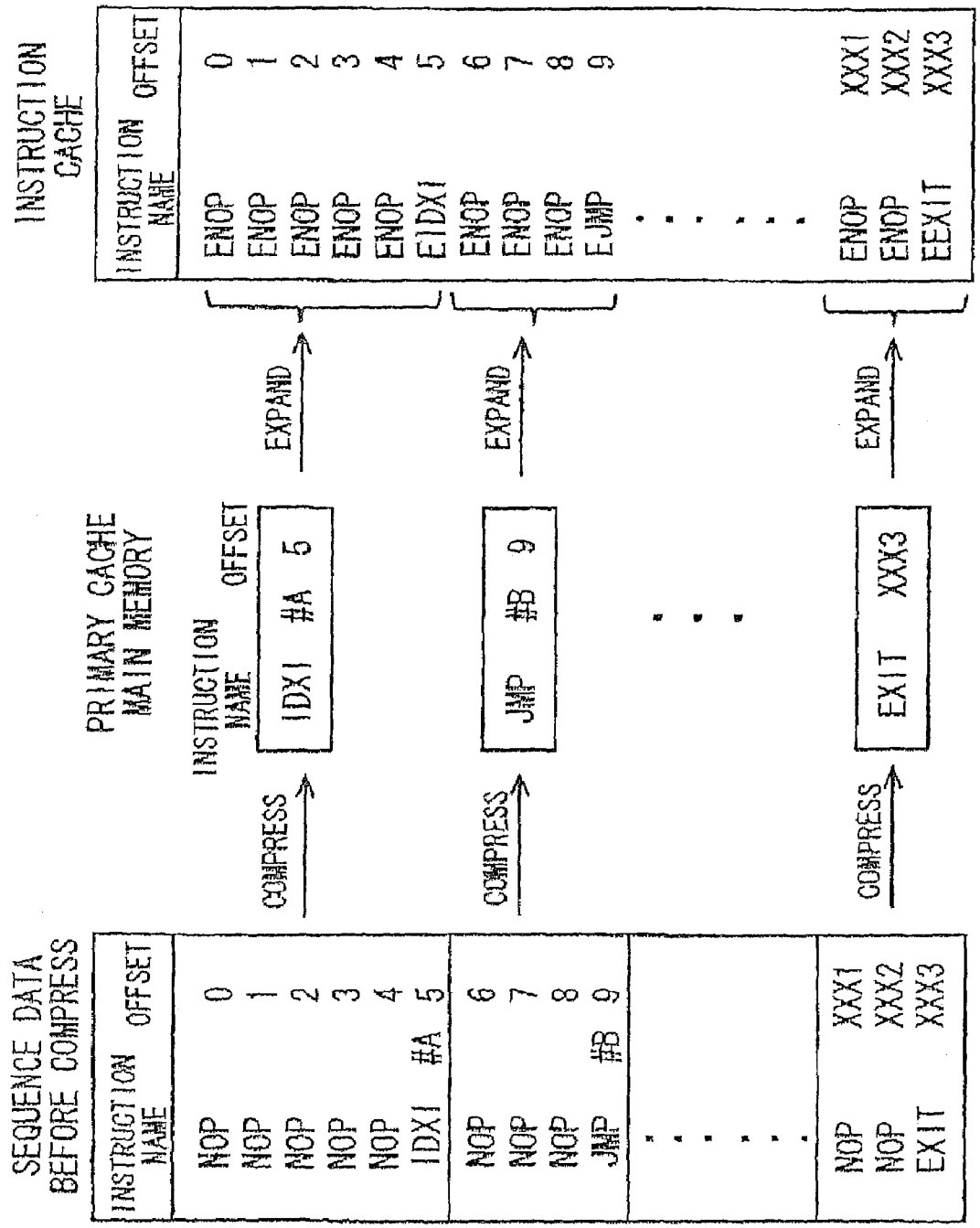
FIG. 6 shows an example of the sequence data before being compressed, the sequence data in the compression format by deleting NOP instruction and the sequence data obtained by expanding the sequence data.

FIG. 6 shows an example of the sequence data before being compressed, the sequence data in the compression format by deleting NOP instruction and the sequence data obtained by expanding the sequence data. The main memory 40 and the primary cache 312 store the compressed sequence data. The compressed sequence data having the amount of data less than that of the sequence data on which all the instructions to define the test sequence are described.

The main memory 40 and the primary cache 312 may store the sequence data in the compression format by compressing a predetermined land of instruction, for example. The predetermined kind of instruction may be NOP instruction, for example. The main memory 40 and the primary cache 312 may store each instruction included in the sequence data in the compression format by deleting the NOP instruction, so that the instruction which is not targeted for compressing is stored, for example. That is, the main memory 40 and the primary cache 312 may store the sequence data including such as DXI instruction, JMP instruction and EXIT instruction except for NOP instruction.

Moreover, fire main memory 40 and the primary cache 312 store the offset of the test pattern corresponding to each instruction which is not targeted for compressing. That is, the main memory 40 and the primary cache 312 store the offset corresponding to each instruction not being targeted for compressing except for NOP instruction, where, each instruction in a non-compressed state has been allocated to the offset.

The expanding section 314 expands the sequence data read from the primary cache 312 to data in a non-compression format. When the sequence data is stored in the primary cache 312 in the compression format by compressing a predetermined land of instruction, the expanding section 314 expands the compressed predetermined kind of instruction in the sequence data read from the primary cache 312 to data in the non-compression format and writes the same to the instruction cache 316.

For example, when the sequence data is stored in the primary cache 312 in the compression format by deleting NOP instruction, the expanding section 314 reproduces the NOP instruction and writes the sequence data in fire non-compression format including the NOP instruction to the instruction cache 316. Specifically, when the offset of the first instruction of the sequence data read from the primary cache 312 is not followed by the offset of the second instruction stored following the first instruction in the primary cache 312, the expanding section 314 reproduces NOP instruction corresponding to each offset from one following the first instruction to one preceding the second instruction.

For example, all the instructions before the fourth instruction are all NOP instructions, and all the instructions between IDXI instruction of the fifth offset and JMP instruction of the ninth offset are NOP instructions as shown in FIG. 6. That is to say, the sequence data stored in the main memory 40 and the primary cache 312 include the IDXI instruction of the fifth offset and the JMP instruction of the ninth offset and does not include the first-fourth and sixth-eighth NOP instructions.

In this case, the expanding section 314 reproduces the NOP instructions of the first-fourth offsets and the NOP instructions of the fifth-ninth offsets. Thereby the expanding section 314 can covert the sequence data in the compression format to the sequence data in the non-compression format which can be executed by the instruction executing section 318.

As described above, the pattern generating section 70 can store the sequence data having the amount of data by the compression format in the main memory 40 and the primary cache 312. Thereby the pattern generating section 70 can reduce the capacity for each of the main memory 40 and the primary cache 312.

Here, reproducing the deleted NOP instruction, the expanding section 314 substitutes the NOP instruction for ENOP instruction having the content the same as that of the NOP instruction and writes the same to the instruction cache 316 in the present embodiment. In addition, reading IDXI instruction from the primary cache 312, the expanding section 314 substitutes the IDXI instruction for EIDXI instruction having the content the same as that of the IDXI instruction to the instruction cache 316 in the present embodiment. Moreover, reading JMP instruction from the primary cache 312, the expanding section 314 substitutes the JMP instruction for EJMP instruction having the content the same as that of the JMP instruction to the instruction cache 316 in the present embodiment.

Figure 7:
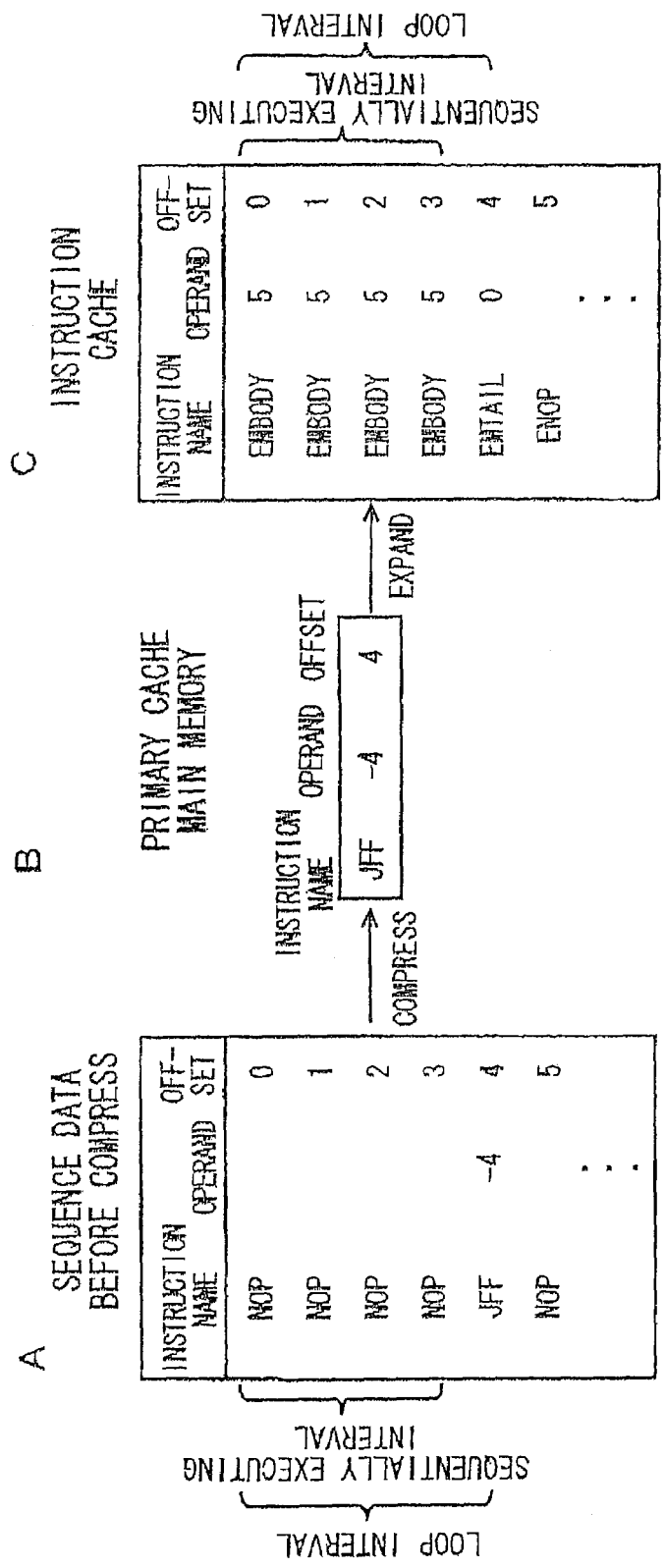
FIG. 7 shows an example of sequence data including a matching control instruction (JFF instruction)

FIG. 7 shows an example of sequence data including a match control instruction (JFF instruction). The sequence data before being compressed may include at least one continuous NOP instructions (sequentially executing interval) and the match control instruction (JFF instruction) following the sequentially executing interval as shown in FIG. 7-A.

The JFF instruction jumps the control to the NOP instruction at the head of the sequentially executing interval provided that the output signal from the device under test 300 is not corresponding to a predesignated value in executing each NOP instruction included in the sequentially executing interval and the JFF instruction (each instruction in the loop interval). In addition, the JFF instruction shifts the control to the offset following the JFF instruction in executing each instruction provided that the output signal from the device under test 300 is corresponding to a predesignated value in executing each NOP instruction included in the loop interval.

For example, the JFF instruction may jump to the NOP instruction at the head of the loop interval provided that the match signal input section 336 does not input any match signal in executing each instruction in the loop interval. In addition, the JFF instruction may shift the control to the instruction following the JFF instruction provided that the match signal input section 336 inputs the match signal in executing each instruction in the loop interval, for example.

Such JFF instruction can keep the test waiting for being executed in the loop interval until a predetermined output signal is outputted from the device under test 300 and restart the test provided that the predetermined output signal is outputted from the device under test 300.

Here, the JFF instruction includes the value to designate the instruction at the jump destination (each instruction in the loop interval) as an operand. The operand of the JFF instruction included in the compressed sequence data is indicated by the difference between the offset of the JFF instruction and that of the instruction at the jump destination (the NOP instruction at the head of the loop interval). That is, the operand of JFF instruction is indicated by the offset of the instruction at the jump destination (the NOP instruction at the head of the loop interval) relative to the JFF instruction.

Reading the JFF instruction from fire primary cache 312, the expanding section 314 substitutes the JFF instruction for a forward jump instruction (EMTAIL instruction) and causes the instruction cache 316 to cache the same as shown in FIG. 7-C. The EMTAIL instruction jumps the control to instruction at the head of the loop interval provided that the output signal from the device under test 300 is not corresponding to a predesignated value in executing the EMTAIL instruction. In addition, the EMTAIL instruction shifts the control to the instruction of the offset following the EMTAIL provided that the output signal from the device under test 300 is corresponding to the predesignated value of the device under test 300 in executing the EMTAIL instruction.

The EMTAIL instruction includes the value for designating the instruction at the jump destination (the instruction at the head of the loop interval) as art operand. The operand of the EMTAIL instruction included in the non-compressed sequence data is indicated by the absolute offset of the instruction at the jump destination (instruction at the head of the loop interval). That is, the operand of the EMTAIL instruction is indicated by the absolute location of the instruction at the jump destination (instruction at the head of the loop interval) in the sequence data. Thus, the expanding section 314 converts the relative offset at the jump destination for the JFF instruction read from the primary cache 312 to the absolute offset and causes the instruction cache 316 to cache the same.

Then, the vector generation control section 332 loads the absolute offset designated by the operand of the EMTAIL instruction into the offset register 330 provided that the output signal from the device under test 300 is not corresponding to a predesignated value in executing the EMTAIL instruction. Thereby the vector generation control section 332 can store in the offset register 330 the offset of the instruction at the head of the loop interval, so that the control can be returned to the instruction at the head of the loop interval.

Moreover, the vector generation control section 332 increments the value of the offset register 330 provided that the output signal from the device under test 300 is corresponding to a predesignated value in executing the EMTAIL instruction. Thereby the vector generation control section 332 can store the offset of the instruction following the EMTAIL instruction in the offset register 330, so that the control can be returned to the instruction following the EMTAIL instruction.

Reading the JFF instruction from the primary cache 312, the expanding section 314 expands each NOP instruction preceding the JFF instruction which is included in the sequentially executing interval. In this case, the expanding section 314 substitutes each NOP instruction included in the sequentially executing interval for the backward jump instruction (EMBODY instruction) and causes the instruction cache 316 to cache the same as shown in FIG. 7C. The EMBODY instruction jumps the control to the instruction following the EMTAIL instruction provided mat the output signal from the device under test 300 is corresponding to a predesignated value in executing the EMBODY instruction. In addition, the EMBODY instruction shirts the control to the instruction following the EMBODY instruction provided that the output signal is not corresponding to a predesignated value in executing the EMBODY instruction.

The EMBODY instruction is an example of instruction which causes the vector generation control section 332 to identify that the EMBODY instruction is in the loop including the JFF instruction. In addition, the EMBODY instruction includes the value for designating the instruction at the jump destination (the instruction following the EMTAIL instruction) as an operand. The operand of the EMBODY instruction included in the non-compressed sequence data is indicated by the absolute offset of the instruction at the jump destination (the instruction following the EMTAIL instruction).

The vector generation control section 332 increments the value of the offset register 330 provided that the output signal from the device under test 300 is not corresponding to a predesignated value in executing the EMBODY instruction. Thereby the vector generation control section 332 can sequentially store the offset of the instruction following each EMBODY instruction in the offset register 330, so that each instruction in the sequentially executing interval can be sequentially executed.

Moreover, the vector generation control section 332 loads the absolute offset designated by the operand of the EMBODY instruction into the offset register 330 provided that the output signal of the device under test 300 is corresponding to a predesignated value in executing the EMBODY instruction. Thereby the vector generation control section 332 can store the offset of the instruction following the EMTAIL instruction in the offset register 330, so that the control can be jumped to the instruction following the EMTAIL instruction.

As described above, the EMTAIL instruction is included in the non-compressed sequence data, so that the vector generation control section 332 can iteratively execute each instruction from the instruction at the head of the loop interval to the EMTAIL instruction until the output signal from the device under test 300 is corresponding to a predesignated value. Moreover, also the EMBODY instruction is included in the non-compressed sequence data, so that the vector generation control section 332 can sequentially execute each instruction in the sequentially executing interval until the output signal from the device under test 300 is corresponding to a predesignated value.

Here, the vector generation control section 332 has to execute within one clock cycle a series of processing including: reading an instruction from the instruction cache 316; performing the instruction; and generating the offset of the following instruction in order to generate a test pattern for each clock cycle. In addition, it is preferred that the vector generation control section 332 can generate a test pattern within shorter clock cycle. However, if the instruction at the jump destination is designated by the absolute offset, the vector generation control section 332 has to subtract the absolute offset from the offset of a jump instruction in executing the jump instruction in order to generate the offset of the instruction at the jump destination.

Meanwhile, the vector generation control section 332 executes the EMTAIL instruction and the EMBODY instruction with each absolute offset of the instruction at the jump destination as an operand in the present embodiment. Therefore, the vector generation control section 332 may directly load the operand value into fire offset register 330 in executing the EMTAIL instruction and the EMBODY instruction to perform the jump processing without the subtraction processing. Thereby the vector generation control section 332 can reduce the processing in executing the jump instruction and generate a test pattern within shorter clock cycle.

Moreover, the expanding section 314 substitutes each NOP instruction in the sequentially executing interval for the EMBODY instruction in the present embodiment. Thereby the vector generation control section 332 can perform the jump processing not only at the end of the loop interval but also in the middle of the loop interval, so that the response time until the test is restarted from when the output signal from the device under test 300 is corresponding to a predesignated value can be shortened. In addition, each of the JFF instruction and the EMTAIL instruction may form an infinite loop of which number of times of looping is not defined, or a finite loop of which number of times of looping is previously defined.

Moreover, the jump instruction may jump to itself or the preceding instruction provided that the output signal is not corresponding to the predesignated value. When the JFF instruction jumps to itself (that is, the operand is 0), the expanding section 314 substitutes the JFF instruction for the EMTAIL instruction and causes the instruction cache 316 to cache the same, but does not cause the instruction cache 316 to cache the EMBODY instruction.

Then, the vector generation control section 332 loads the operand (0) of the EMTAIL instruction into the offset register 330 provided that the output signal from the device under test 300 is corresponding to a predesignated value in executing the EMTAIL instruction. Thereby the vector generation control section 332 can reduce the processing in executing the jump instruction.

Figure 8:
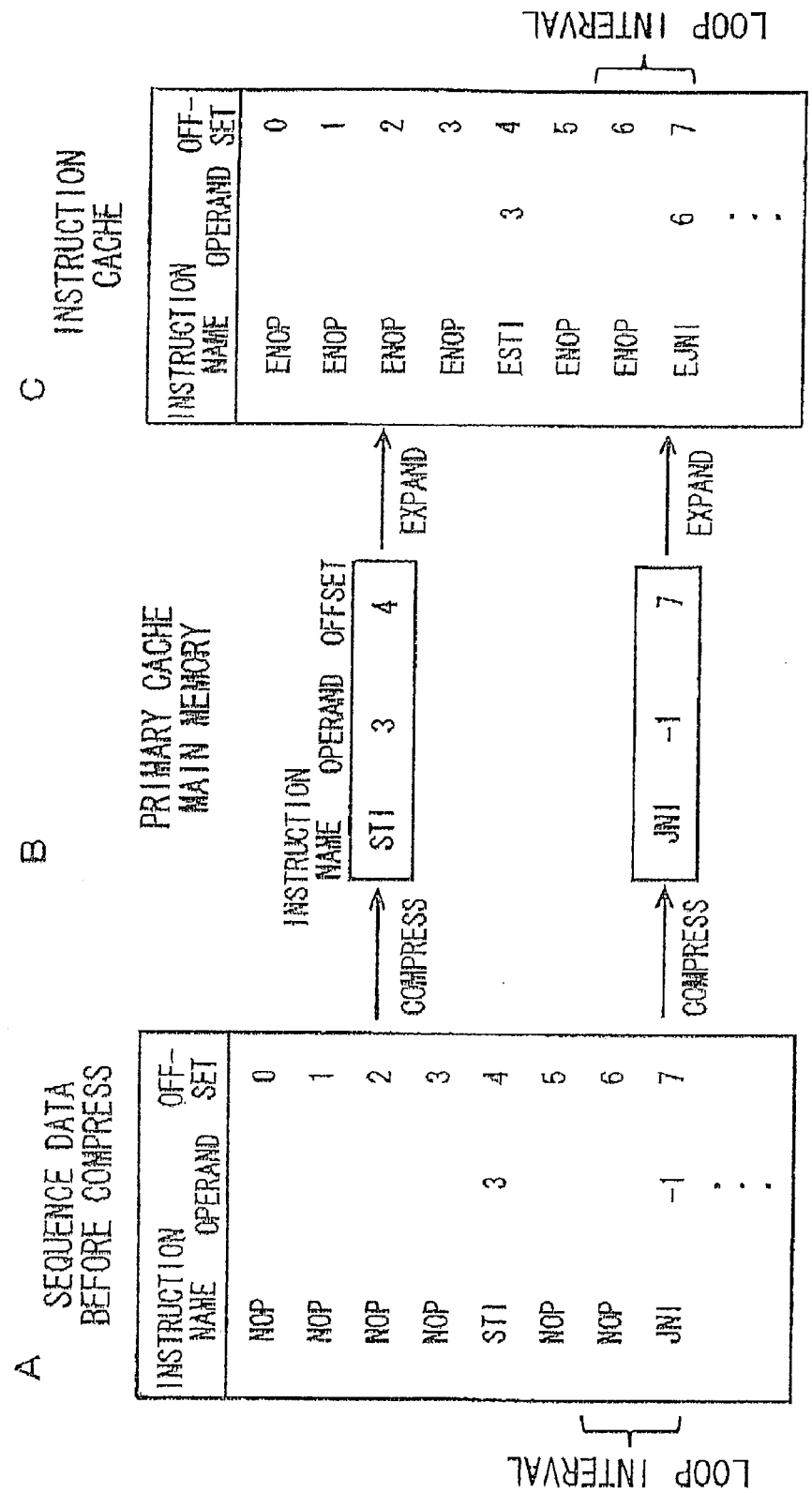
FIG. 8 shows an example of sequence data including au instruction to designate the number of times (STI instruction) and a loop jump instruction (JNI instruction)

FIG. 8 shows an example of sequence data including an instruction to designate the number of times (STI instruction) and a loop jump instruction (JNI instruction). The sequence data before being compressed may include an instruction to designate the number of times (STI instruction) and a loop jump instruction (JNI instruction) as shown in FIG. 8-A, for example.

The STI instruction designates the number of times of iteration to iteratively perform the loop interval including one or more instructions. Specifically, the STI instruction designates the number of times of iteration of the loop interval formed by the JNI instruction. The STI instruction includes the number of times of iteration as an operand, for example. The STI instruction is disposed before the loop interval in the sequence data.

The JNI instruction is disposed at the end of the loop interval including one or more instructions. Here, the loop interval may include only one JNI instruction. In this case, the head and the end of the loop interval are the same. The JNI instruction jumps the control to the instruction at the head of the loop interval provided that the number of times of executing the loop interval does not accomplish the number of times of iteration which is designated by the last STI instruction. In addition, the JNI instruction shifts the control to the instruction following the JNI instruction provided that the number of times of executing the loop interval accomplishes the number of times of iteration which is designated by the last STI instruction.

Here, the JNI instruction includes the value for designating the instruction at the jump destination (the head of the instruction in the loop interval) as an operand as shown in FIG. 8-B. When the loop interval includes only one JNI instruction, the JNI instruction includes the value for designating itself as the operand. The operand for the JNI instruction included in the compressed sequence data is indicated by the difference between the offset of the JIN instruction and that of the instruction at the jump destination (instruction at the head of the loop interval). That is, the operand for the JNI instruction is indicated by the offset relative to the instruction at the jump destination (instruction at the bead of the loop interval).

Reading STI instruction from the primary cache 312, the expanding section 314 substitutes the STI instruction for ESTI instruction being an instruction to designate the number of times, which is the same as the STI instruction and causes the instruction cache 316 to cache the same. In addition, reading JNI instruction, the expanding section 314 substitutes the JNI instruction for EJNI instruction and causes the instruction cache 316 to cache the same. The EJNI instruction jumps the control to the instruction at the head of the loop interval provided that the number of times of executing the loop interval does not accomplish the number of times of iteration which is designated by the last ESTI instruction. In addition, the EJNI instruction shifts the control to the instruction following the EJNI instruction provided that the number of times of performing the loop interval accomplishes the number of times of iteration designated by the last ESTI instruction.

The EJNI instruction includes the value to designate the instruction at the jump destination (instruction at the head of the loop interval) as an operand. The operand for the ESTI instruction included in the non-compressed sequence data is designated by the absolute offset of lire instruction at the jump destination (instruction at the head of the loop interval). Therefore, the expanding section 314 converts the relative offset at the jump destination of the JNI instruction read from the primary cache 312 to the absolute offset and causes file instruction cache 316 to cache the same. Thereby the vector generation control section 332 can perform the jump processing only by directly loading the operand value into the offset register 330 in executing the EJNI instruction.

The vector generation control section 332 pushes on the stack 340 the number of times of iteration which is designated by the ESTI instruction in executing the ESTI instruction. Thereby the stack 340 can store the number of times of iteration designated by the ESTI instruction at the head thereof.

The vector generation control section 332 decrements the number of times of iteration which is recorded at the head of the stack 340 provided that the number of times of iteration recorded at the head of the stack 340 is not 0 in executing the EJNI instruction. In this case, the vector generation control section 332 loads the absolute offset designated by the operand of the EJNI instruction into the offset register 330. Thereby the vector generation control section 332 can return the processing to the head of the loop interval. In addition, the vector generation control section 332 pops the number of time of iteration from the stack 340 provided that the number of time of iteration at the head of the stack 340 is 0 and shifts the control to the following instruction. Thereby the vector generation control section 332 can shift the control to the following instruction in the loop interval in response to that the loop interval is performed by the designated number of times of iteration.

Figure 9:
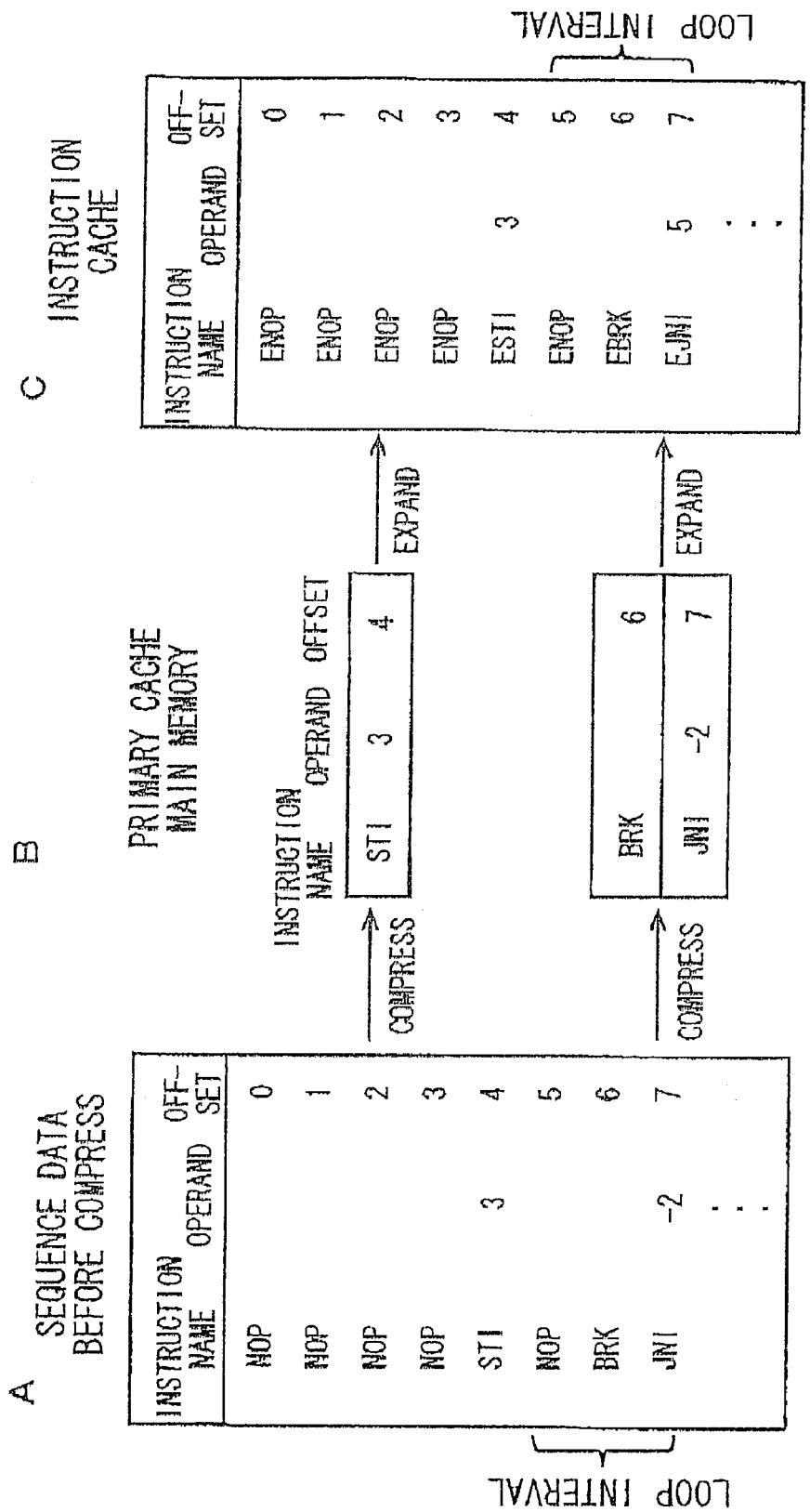
FIG. 9 shows an example of sequence data including a break instruction (BRK instruction)

FIG. 9 shows an example of sequence data inducting a break instruction (BRK instruction). For example, the sequence data before being compressed may include a break instruction (BRK instruction) in the loop interval formed by the JNI instruction as shown in FIG. 9-A.

The BRK instruction instructs to terminate the loop by the JNI instruction. Specifically, the BRK instruction exits the processing within the loop interval and shifts the control to the instruction following the JNI instruction in executing the JNI instruction following the BRK instruction.

Reading BRK instruction from the primary cache 312, the expanding section 314 substitutes the BRK instruction for EBRK instruction being a break instruction the same as the BRK instruction and causes the instruction cache 316 to cache the same. The vector generation control section 332 controls the number of times of iteration recorded at the head of the stack 340 to 0 in executing the EBRK instruction. Then, after executing each instruction after the EBRK instruction (i.e. each instruction from the EBRK instruction to the EJNI instruction), the vector generation control section 332 executes the instruction following the EJNI instruction. Thereby the vector generation control section 332 can forcibly terminate the loop regardless of the number of times of iteration designated by the STI instruction.

Figure 10:
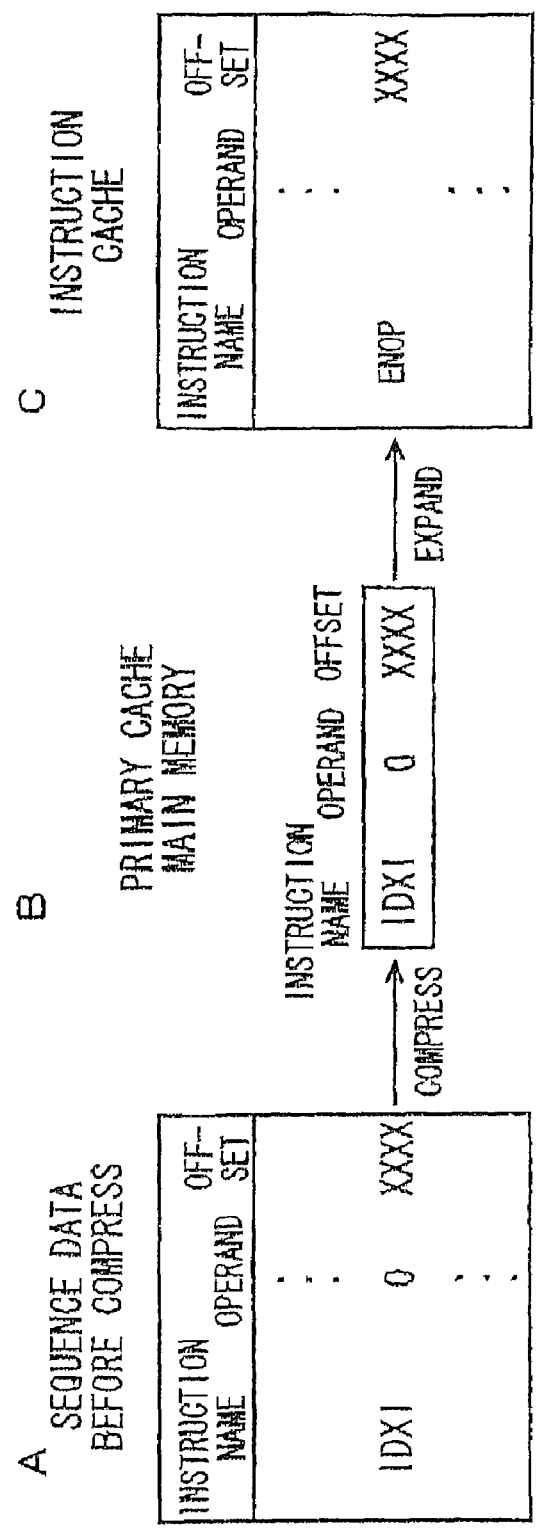
FIG. 10 shows an example of e sequence data including air iteration instruction (IDXI instruction)

FIG. 10 shows an example of e sequence data including an iteration instruction (IDXI instruction). For example, the sequence data before being compressed may include IDXI instruction as shown in FIG. 10-A.

Reading IDXI instruction from the primary cache 312, the expanding section 314 substitutes the IDXI instruction for NOP instruction and causes the instruction cache 316 to cache the same in response to detect that tine number of times of iteration designated by the IDXI instruction is once. The expanding section 314 substitutes the IDXI instruction to designate one time of iterating for ENOP instruction and causes the instruction cache 316 to cache the same in the present embodiment.

Here, if the IDXI instruction is executed, the vector generation control section has to execute within one clock cycle the processing including: reading the current number of times of iteration from the register; determining whether the read number of times of iteration is 0; and decrementing the register provided that the read number of times of iteration is not 0. In addition, the vector generation control section 332 has to perform a processing to load the designated number of times of iteration into the register before the above described processing in executing the first cycle of the IDXI instruction.

Meanwhile, it assures that the number of limes of iteration which is designated by the IDXI instruction is equal to or more than 2 in the present embodiment. Therefore, the vector generation control section 332 may perform only the load processing without performing the reading, determining and decrementing processing in executing the first cycle of the IDXI instruction. Therefore, the vector generation control section 332 can reduce the number of processing to be executed in the first cycle of the IDXI instruction. Thereby the vector generation control section 332 can reduce the processing in executing the IDXI instruction and generate a test pattern within shorter clock cycle.

Figure 11:
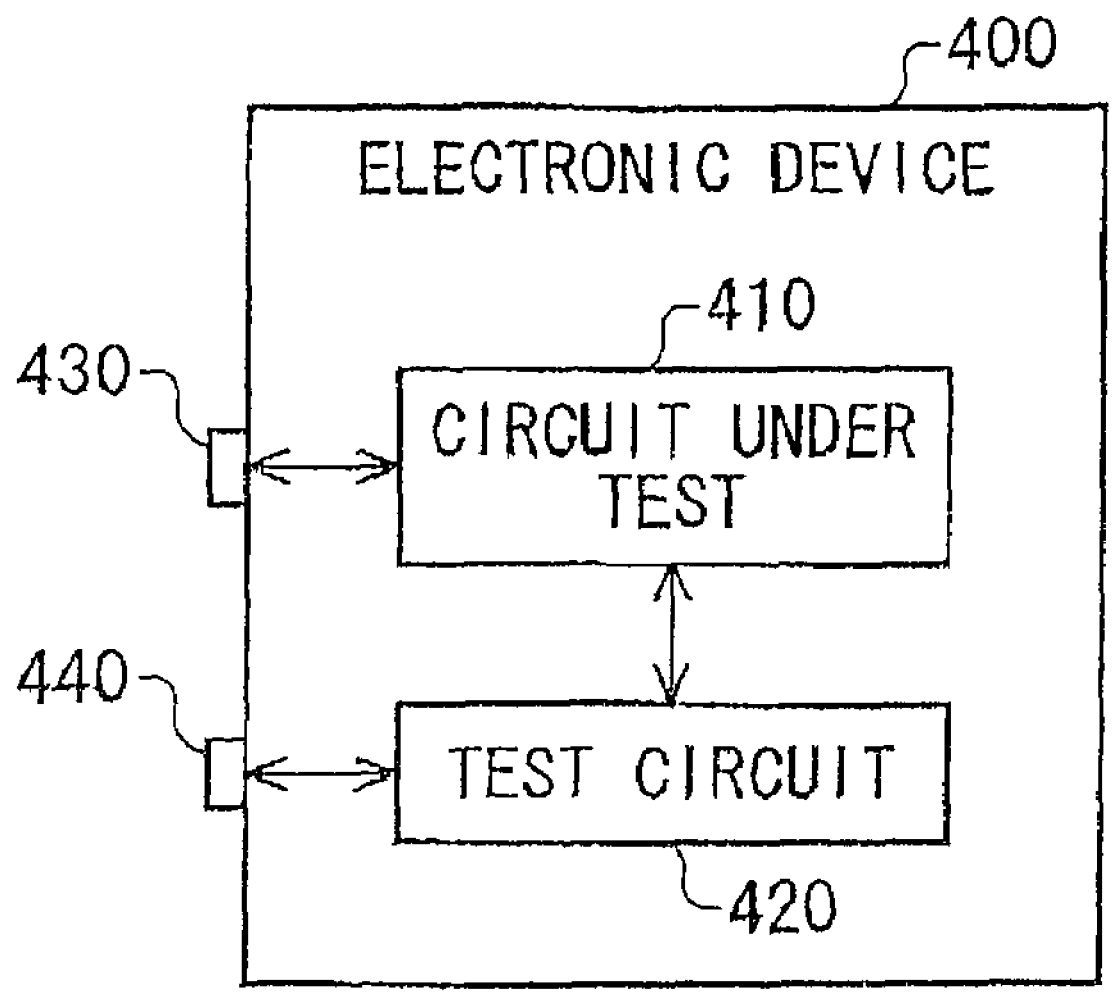
FIG. 11 shows an example of configuration of air electronic device 400 according to an embodiment of the present invention.

FIG. 11 shows an example of an electronic device 400 according to an embodiment of the present invention. The electronic device 400 includes a circuit under test 410, a test circuit 420, an input/output pin 430 and a BIST pin 440. The circuit under test 410 may be a circuit that operates when the electronic device 400 actually operates. The circuit under test 410 operates in accordance to a signal provided from the input/output pin 430 when the electronic device actually operates.

For example, in a case that the electronic device 400 is a memory device, the circuit under test 410 may be a circuit including a memory cell of the electronic device 400. For example, the circuit under test 410 may be a memory cell and a control circuit that controls the memory cell. The control circuit may be a circuit that controls to write data to the memory cell and read data from the memory cell.

The test circuit 420 is provided on a semiconductor chip on which the circuit under test 410 is also provided and tests the circuit under test 410. The test circuit 420 may have the configuration the same as that of the test module 100 described with reference to FIG. 1-FIG. 9. In addition, the test circuit 420 may have a part of configuration of the test module 100. Moreover, the test circuit 420 may be a circuit drat performs a part of function of the test module 100. For example, the test circuit 420 does not necessarily need the result memory 16. Then, the rate generating section 30 and the timing generating section 56 of the test circuit 420 may operate by a setting value of the fixed timing set.

Moreover, the test circuit 420 may test the circuit under test 410 when a signal indicating that a self-test of the circuit under test 410 is performed is provided from an external test apparatus through the BIST pin 440. It is preferred that the BIST pin 440 is not used when the electronic device 400 actually operates. Then, the test circuit 420 may output the test result of the circuit under test 410 from the BIST pin 440 to the external test apparatus.

The external test apparatus may operate as well as the site control device 130 described above with reference to FIG. 1. That is, the test control program, the test program data and the test pattern data and so forth may be provided to the test circuit 420 in order to operate the test circuit 420 as well as the test module 100 described above with reference to FIG. 1-FIG. 9.

While the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A test apparatus that tests a device under test, comprising:
   a pattern memory that stores a test instruction sequence which defines a test sequence to test the device under test in a compression format which compresses a predetermined kind of instruction in the test instruction sequence;
   an expanding section that expands the test instruction sequence read from the pattern memory to that in the non-compression format;
   an instruction cache that caches the test instruction sequence expanded by the expanding section;
   a pattern generating section that sequentially reads the instructions stored in the instruction cache and executes the same to generate a test pattern for the executed instruction, the pattern generating section including:
      a vector generation control section that sequentially reads the instructions stored in the instruction cache and executes the same to update the value of an offset register that stores the executed instruction and an offset of the corresponding test pattern; and
      a pattern generator that outputs the test pattern corresponding to the offset stored in the offset register of the vector generation control section; and
   a signal outputting section that generates a test signal based on the test pattern and provides the same to the device under test,
   wherein
      the expanding section expands the compressed predetermined kind of instruction in the test instruction sequence read from the pattern memory to an instruction in the non-compression format and writes the same to the instruction cache, the predetermined kind of instruction includes an NOP (No operation) instruction which does not change the test sequence and also does not explicitly change a register value in the test apparatus, the pattern memory stores each instruction other than the NOP instruction included in the test instruction sequence in the compression format without the NOP instruction and stores the offset of the test pattern corresponding to each instruction other than the NOP instruction, the expanding section reproduces the NOP instruction corresponding to each offset from the offset following a first instruction to the offset preceding a second instruction when the offset of the first instruction in the test instruction sequence read from the pattern memory is not immediately followed by the offset of the second instruction stored following the first instruction, the vector generation control section increments the offset every time each instruction is sequentially executed and loads the offset at a jump destination into the offset register when a jump instruction is executed, the test instruction sequence includes at least one NOP instruction and a match control instruction following the at least one NOP instruction that jumps to the head of the at least one NOP instruction provided that the output signal from the device under test is not corresponding to a predesignated value in executing the at least one NOP instruction, and the expanding section, when the match control instruction is read from the pattern memory, expands the at least one NOP instruction preceding the match control instruction and causes the instruction cache to cache the same as an instruction that the pattern generation section can identify as within a loop including the match control instruction.

2. The test apparatus as set forth in claim 1, wherein the expanding section causes the instruction cache to cache, of the instructions within the loop including the match control instruction, each instruction with which the offset of the instruction following the match control instruction is associated, and the vector generation control section jumps to the instruction following the match control instruction by loading the offset associated with the at least one NOP instruction into the offset register provided that the output signal from the device under test is corresponding to the predesignated value in executing the instruction within the loop including the match control instruction.

3. The test apparatus as set forth in claim 1, wherein the test instruction sequence includes a match control instruction that jumps to itself or the preceding instruction provided that the output signal from the device under test is not corresponding to the predesignated value, the expanding section converts a relative offset at the jump destination for the match control instruction read from the pattern memory to an absolute offset and causes the instruction cache to cache the same, and the pattern generating section loads the absolute offset into the offset register provided that the output signal from the device under test is not corresponding to the predesignated value in executing the match control instruction.

4. The test apparatus as set forth in claim 1, wherein the vector generation control section pushes on a stack the number of times of iteration designated by an instruction to designate the number of times in executing the instruction to designate the number of times of iteratively executing a loop interval including one or more instructions, the vector generation control section, when there is a loop jump instruction at the end of the loop interval, in executing the loop jump instruction, decrements the number of times of iteration recorded at the head of the stack and jumps to the head of the loop interval provided that the number of times recorded at the head of the stack is not 0, and pops the number of times of iteration out from the stack to shift the control to the following instruction provided that the number of times of iteration recorded at the head of the stack is 0, and the vector generation control section controls the number of times of iteration at the head of the stack to 0 in the case that a break instruction to instruct to terminate the loop in the middle of the loop interval is executed and executes the instruction following the loop jump instruction after each instruction subsequent to the break instruction within the loop interval.

5. The test apparatus as set forth in claim 1, wherein, in the case that an iteration instruction executed by a designated number of times of iteration is read from the pattern memory, the expanding section substitutes the iteration instruction for the NOP instruction and causes the instruction cache to cache the same in response to detecting that the designated number of times of iteration is once.

6. An electronic device comprising a circuit under test and a test circuit that tests the circuit under test, the test circuit including:

a pattern memory that stores a test instruction sequence which defines a test sequence to test the circuit under test in a compression format which compresses a predetermined kind of instruction in the test instruction sequence;

an expanding section that expands the test instruction sequence read from the pattern memory to that in the non-compression format;

an instruction cache that caches the test instruction sequence expanded by the expanding section;

a pattern generating section that sequentially reads the instructions stored in the instruction cache and executes the same to generate a test pattern for the executed instruction, the pattern generating section including:

a vector generation control section that sequentially reads the instructions stored in the instruction cache and executes the same to update the value of an offset register that stores the executed instruction and an offset of the corresponding test pattern; and a pattern generator that outputs the test pattern corresponding to the offset stored in the offset register of the vector generation control section; and a signal outputting section that generates a test signal based on the test pattern and provides the same to the circuit under test, wherein the expanding section expands the compressed predetermined kind of instruction in the test instruction sequence read from the pattern memory to an instruction in the non-compression format and writes the same to the instruction cache, the predetermined kind of instruction includes an NOP (No operation) instruction which does not change the test sequence and also does not explicitly change a register value in the test circuit, the pattern memory stores each instruction other than the NOP instruction included in the test instruction sequence in the compression format without the NOP instruction and stores the offset of the test pattern corresponding to each instruction other than the NOP instruction, the expanding section reproduces the NOP instruction corresponding to each offset from the offset following a first instruction to the offset preceding a second instruction when the offset of the first instruction in the test instruction sequence read from the pattern memory is not immediately followed by the offset of the second instruction stored following the first instruction, the vector generation control section increments the offset every time each instruction is sequentially executed and loads the offset at a jump destination into the offset register when a jump instruction is executed, the test instruction sequence includes at least one NOP instruction and a match control instruction following the at least one NOP instruction that jumps to the head of the at least one NOP instruction provided that the output signal from the circuit under test is not corresponding to a predesignated value in executing the at least one NOP instruction, and the expanding section, when the match control instruction is read from the pattern memory, expands the at least one NOP instruction preceding the match control instruction and causes the instruction cache to cache the same as an instruction that the pattern generation section can identify as within a loop including the match control instruction.

7. The test circuit as set forth in claim 6, wherein the expanding section causes the instruction cache to cache, of the instructions within the loop including the match control instruction, each instruction with which the offset of the instruction following the match control instruction is associated, and the vector generation control section jumps to the instruction following the match control instruction by loading the offset associated with the at least one NOP instruction into the offset register provided that the output signal from the circuit under test is corresponding to the predesignated value in executing the instruction within the loop including the match control instruction.

8. The test circuit as set forth in claim 6, wherein the test instruction sequence includes a match control instruction that jumps to itself or the preceding instruction provided that the output signal from the circuit under test is not corresponding to the predesignated value, the expanding section converts a relative offset at the jump destination for the match control instruction read from the pattern memory to an absolute offset and causes the instruction cache to cache the same, and the pattern generating section loads the absolute offset into the offset register provided that the output signal from the circuit under test is not corresponding to the predesignated value in executing the match control instruction.

9. The test apparatus as set forth in claim 6, wherein the vector generation control section pushes on a stack the number of times of iteration designated by an instruction to designate the number of times in executing the instruction to designate the number of times of iteratively executing a loop interval including one or more instructions, the vector generation control section, when there is a loop jump instruction at the end of the loop interval, in executing the loop jump instruction, decrements the number of times of iteration recorded at the head of the stack and jumps to the head of the loop interval provided that the number of times recorded at the head of the stack is not 0, and pops the number of times of iteration out from the stack to shift the control to the following instruction provided that the number of times of iteration recorded at the head of the stack is 0, and the vector generation control section controls the number of times of iteration at the head of the stack to 0 in the case that a break instruction to instruct to terminate the loop in the middle of the loop interval is executed and executes the instruction following the loop jump instruction after each instruction subsequent to the break instruction within the loop interval.

10. The test apparatus as set forth in claim 6, wherein, in the case that an iteration instruction executed by a designated number of times of iteration is read from the pattern memory, the expanding section substitutes the iteration instruction for the NOP instruction and causes the instruction cache to cache the same in response to detecting that the designated number of times of iteration is once.

* * * * *